US006888406B2

United States Patent
Ashby et al.

(10) Patent No.: US 6,888,406 B2
(45) Date of Patent: May 3, 2005

(54) HIGHLY LINEAR VARIABLE GAIN AMPLIFIER

(75) Inventors: Kirk B. Ashby, McKinney, TX (US); Oliver I. Werther, McKinney, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 10/217,076

(22) Filed: Aug. 12, 2002

(65) Prior Publication Data

US 2004/0027200 A1 Feb. 12, 2004

(51) Int. Cl.[7] .................................................. H03F 3/45
(52) U.S. Cl. ........................ 330/254; 330/263; 330/278
(58) Field of Search ................................ 327/254, 259, 327/260, 263, 264, 265, 278, 279

(56) References Cited

U.S. PATENT DOCUMENTS

| | | | | |
|---|---|---|---|---|
| 4,070,633 A | * | 1/1978 | Gay | 330/254 |
| 4,551,687 A | * | 11/1985 | Lukens | 330/258 |
| 4,963,836 A | * | 10/1990 | Noguchi et al. | 330/254 |
| 5,057,787 A | * | 10/1991 | Arai et al. | 330/254 |
| 5,389,896 A | | 2/1995 | Kobayashi | |
| 5,424,690 A | * | 6/1995 | Ohno | 331/57 |
| 5,430,765 A | * | 7/1995 | Nagahori | 375/318 |
| 5,436,594 A | * | 7/1995 | Pace et al. | 330/258 |
| 5,463,349 A | * | 10/1995 | Petersen et al. | 330/254 |
| 5,563,916 A | | 10/1996 | Scarpa | |
| 5,917,379 A | * | 6/1999 | Ashby et al. | 330/260 |
| 5,999,050 A | | 12/1999 | Baltus | |
| 6,032,109 A | | 2/2000 | Ritmiller, III | |
| 6,049,252 A | | 4/2000 | Iwata | |
| 6,069,866 A | * | 5/2000 | Pietruszynski et al. | 369/124.11 |
| 6,078,219 A | * | 6/2000 | Hadjichristos et al. | 330/254 |
| 6,150,885 A | * | 11/2000 | Ashby et al. | 330/257 |
| 2002/0039413 A1 | | 4/2002 | Siniscalchi et al. | |

FOREIGN PATENT DOCUMENTS

| | | |
|---|---|---|
| EP | 0 600 852 | 6/1994 |
| GB | 2 140 994 | 12/1984 |
| WO | WO 01/35527 A2 | 5/2001 |

OTHER PUBLICATIONS

International Search Report Issued for PCT/US 03/25115, dated Jun. 21, 2004.
"Analog Integrated Circuit Design", David A. Johns and Ken Martin, 1958, pp. 589, 598, 643 and 645.
"A 2.5–V Active Low–Pass Filter Using All–n–p–n Gilbert Cells with a 1–V$_{p-p}$ Linear Input Range", Mikio Koyama, et al., IEEE Journal of Solid–State Circuits, vol. 28, No. 12, Dec. 1993, pp. 1246–1253.
"A Low Distortion Bipolar Mixer for Low Voltage Direct Up–Conversion and High IF Frequency Systems", Farbod Behbahani, et al., Proceedings of the 1996 Bipolar/BiCMOS Circuits and Technology Meeting, 1996, pp. 50–52.
International Search Report issued for PCT/US 03/25115, dated Aug. 31, 2004.

* cited by examiner

Primary Examiner—Timothy P. Callahan
Assistant Examiner—An T. Luu
(74) Attorney, Agent, or Firm—Fulbright & Jaworski L.L.P.

(57) ABSTRACT

Disclosed are systems and methods which provide very linear amplification of signals using a linearized transconductance circuit. A transconductance amplifier configuration is shown which provides highly linearized operation utilizing a Darlington pair feedback circuit. Also shown are gain control configurations in which current steering circuitry is adapted to operate in its most linear region.

37 Claims, 3 Drawing Sheets

HIGHLY LINEAR VARIABLE GAIN AMPLIFIER

TECHNICAL FIELD

The present invention relates generally to signal processing and, more particularly, to providing amplification of a signal while minimizing distortion introduced with respect to the signal.

BACKGROUND OF THE INVENTION

It is often desirable to provide amplification of signals, such as radio frequency (RF) signals, for further signal processing. Additionally, it is often desirable to provide such signal amplification with variable gain. For example, with respect to some signals the objective may be to create a constant output signal with a varying input signal. Such a situation is typical in a receiver where, because of signal fading, changes in the transmission medium, changes at a corresponding transmitter, etcetera, a signal or signals having time varying amplitudes may be provided to a receiver input, but a constant signal level is desired at the output, such as to provide a constant sound level or to facilitate further signal processing. Accordingly, a variable gain amplifier (VGA) may be utilized in the receiver to adjust the gain as a function of the received signal level in order to equalize the output level.

Alternatively, with respect to other signals the objective may be to create a variable output signal with a constant input signal. Such a situation is not uncommon in a transmitter where, depending upon the final application for the transmitter, the particular transmission medium utilized, changes in the transmission medium, changes at a corresponding receiver, etcetera, a signal or signals having constant amplitudes may be provided to a transmitter input, but a selectable or variable signal level is desired at the output, such as to provide a desired signal level at a receiver irrespective of a transmission medium.

One situation in which a variable gain amplifier may be used in transmission of signals is in a cable television head-end system. In such a situation the signal or signals to be transmitted are often provided to the transmitter with a relatively constant amplitude. Due to the particular application a transmitter is deployed in, changes in the signal transmission path, etcetera, the signal output level of the transmitter may be varied, such as to provide a desired or relatively constant signal level at downstream cable equipment. However, such an environment requires highly linear signal processing so as to introduce very little distortion into the signals. Specifically, a cable transmission system typically transmits a large number of broadband signals which are closely spaced, resulting in a very dense signal environment. Accordingly, high linearity is required in order to avoid not only distortion of the individual signals, but to avoid interference among and between the signals.

Therefore, a need exists in the art for providing very linear amplification of signals. Moreover, a need exists in the art for highly linear amplifiers to provide variable gain. A further need exists in the art for a highly linear variable gain amplifier, such as may be utilized with respect to the transmission of cable television signals.

BRIEF SUMMARY OF THE INVENTION

The present invention is directed to systems and methods which provide very linear amplification of signals using a linearized transconductance circuit. According to an embodiment of the present invention, a transconductance amplifier configuration is utilized in which a feedback circuit of the transconductance amplifier is adapted to linearize the operation of the transconductance amplifier. Additionally or alternatively, embodiments of the present invention provide a gain control configuration adapted to operate in its most linear region.

According to a preferred embodiment of the present invention, linearization of the operation of a transconductance amplifier is provided using a feedback circuit having a Darlington pair of transistors. In this configuration, the transistors of the Darlington pair may be utilized to provide a feedback loop as well as a current buffer. Accordingly, a transistor of the Darlington pair provides control of base current leakage, thereby providing improved linearity in the voltage to current conversion of the transconductance amplifier according to a preferred embodiment.

According to a preferred embodiment of the present invention, a variable gain configuration is implemented using a fine gain control and a course gain control. A preferred embodiment provides current steers for fine gain control and selectable coarse gain stages allowing operation of the current steers in their most linear area of operation. Preferably, switches are implemented with respect to selection of gain so as to optimize the linearity with respect to the currents flowing through the current steering network.

A technical of the present invention is provided in that amplification of signals is achieved with highly linear results. Moreover, a technical advantage of the present invention is realized in that highly linear variable gain amplifiers are provided. A further technical advantage is that a variable gain amplifier of the present invention provides linearity suitable for use with respect to the transmission of cable television signals, such as at a cable head-end system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
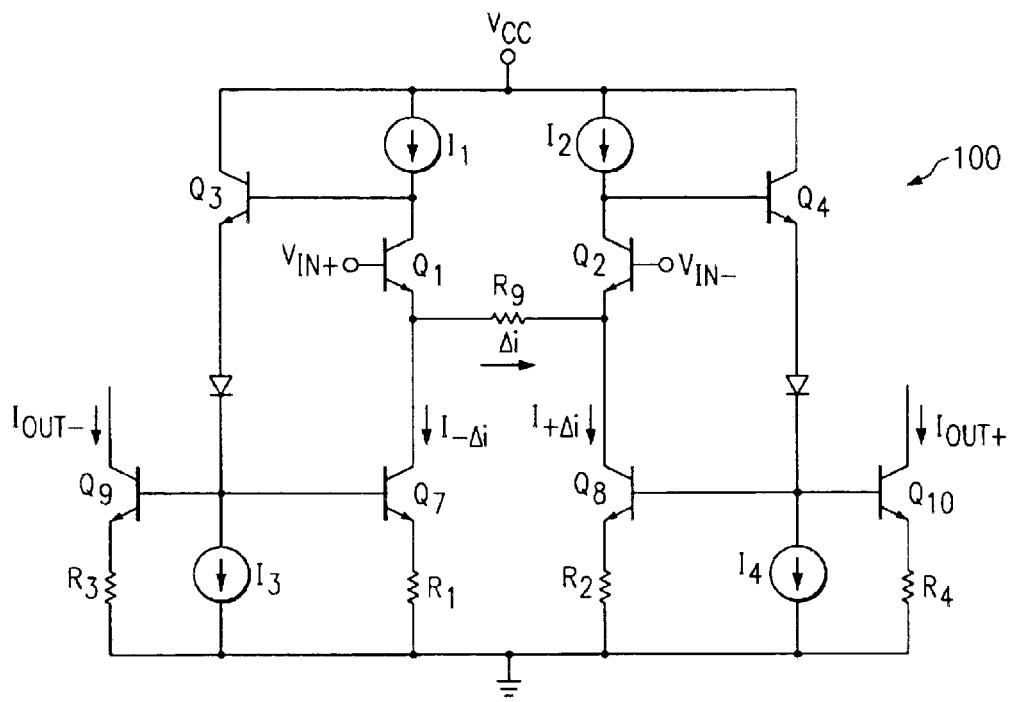
FIG. 1 shows a typical prior art transconductance amplifier configuration.

A highly linear variable gain amplifier according to an embodiment of the present invention utilizes a transconductance amplifier at its core. Directing attention to FIG. 1, transconductance amplifier 100, as is common in the prior art, is shown. Transconductance amplifier 100 includes two identical current sources, $I_1$ and $I_2$, driving the collector of transistors $Q_1$ and $Q_2$, respectively, which are provided as a differential pair. Transistors $Q_3$ and $Q_4$, having their bases coupled to a respective one of current sources $I_1$ and $I_2$ and their emitters coupled to the bases of a respective one of transistors $Q_7$ and $Q_8$, are coupled in an emitter follower configuration as feedback devices. Current sources $I_3$ and $I_4$ provide bias currents to feedback transistors $Q_3$ and $Q_4$ respectively.

A conversion of voltage to current is provided by transconductance amplifier 100 in that the collector current of differential pair transistors $Q_7$ and $Q_8$ is a function of the voltage provided to the base of a respective one of transistors $Q_1$ and $Q_2$. Transistors $Q_9$ and $Q_{10}$ are coupled to transistors $Q_7$ and $Q_8$ to provide current mirroring and, thereby, provide output current to drive desired circuitry. The gain of transconductance amplifier 100 is a function of the ratio of the sizing of transistors $Q_9$ and $Q_{10}$, and their respective emitter degeneration resistors $R_3$ and $R_4$, to the sizing of transistors $Q_7$ and $Q_8$, and their respective emitter degeneration resistors $R_1$ and $R_2$, and the size of the emitter degeneration resistor $R_9$.

It should be appreciated that the feedback loops associated with transistors $Q_3$ and $Q_4$ adjust the current in transistors $Q_1$ and $Q_2$ to maintain a degree of linearity in the voltage to current conversion provided by transconductance amplifier 100. Specifically, as the collector of transistor $Q_1$ is coupled to the base of transistor $Q_3$, that creates a feedback that helps keep the current in transistor $Q_1$ constant. Similarly, the collector of transistor $Q_2$ is coupled to the base of transistor $Q_4$ to create a feedback that helps keep the current in transistor $Q_2$ constant. However, there is a finite amount of base current that is required for the operation of transistors $Q_3$ and $Q_4$. This base current results in a deviation of the amount of current actually going into the collector of transistors $Q_1$ and $Q_2$ and results in a slight modulation in the emitter base voltage of transistors $Q_1$ and $Q_2$. Such a modulation of this voltage creates a non-linearity with respect to the operation of transconductance amplifier 100. For many applications this small linearity error may be acceptable. However, applications having high linearity requirements, such as in providing transmission of cable television signals at a cable head-end, the linearity error associated with this configuration is too great.

Figure 2:
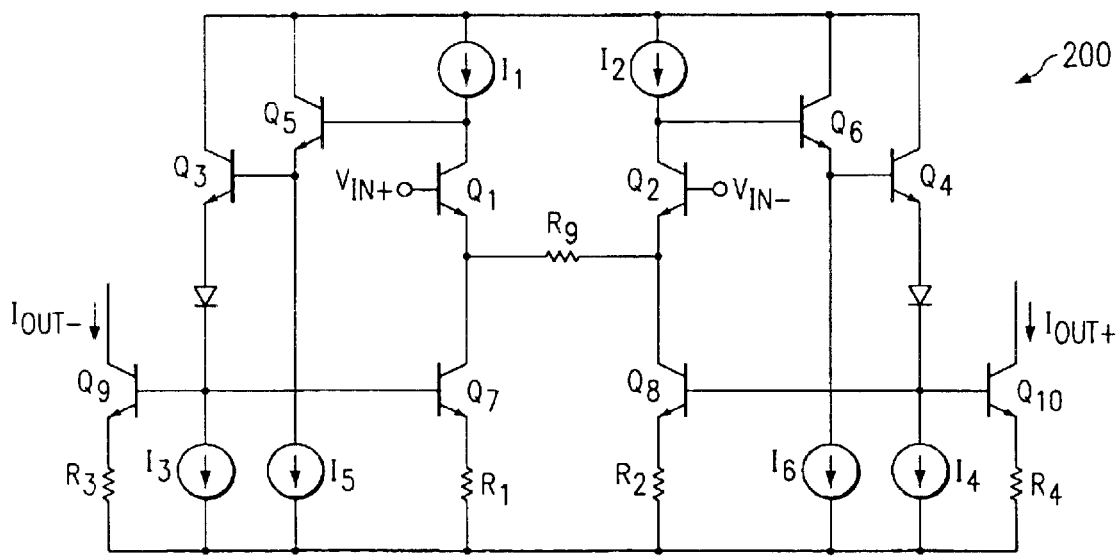
FIG. 2 shows a highly linear transconductance amplifier according to an embodiment of the present invention.

Directing attention to FIG. 2, a preferred embodiment transconductance amplifier configuration adapted to provide improved linearity according to the present invention is shown as transconductance amplifier 200. Transconductance amplifier 200 of the illustrated embodiment includes Darlington pair transistors $Q_3$ and $Q_5$ and Darlington pair transistors $Q_4$ and $Q_6$ coupled in a feedback configuration with respect to the differential pair transistors of transconductance amplifier 200. Specifically, transistor $Q_5$ has been added as an emitter follower in series with transistor $Q_3$ and transistor $Q_6$ has been added as an emitter follower in series with transistor $Q_4$.

It should be appreciated that the circuitry of transconductance amplifier 200 is symmetrical and, therefore, operation with respect to one half of the circuit may be described and the operation of the remaining half of the circuit understood. Accordingly, the discussion below will focus upon the left half of transconductance amplifier 200 (transistors $Q_1$, $Q_3$, $Q_5$, and $Q_7$, current sources $I_1$, $I_3$, and $I_5$, and resistors $R_1$ and $R_3$) with it being understood that the remaining half of the circuit (transistors $Q_2$, $Q_4$, $Q_6$, and $Q_8$, current sources $I_2$, $I_4$, and $I_6$, and resistors $R_2$ and $R_4$) operates in a similar fashion.

According to the illustrated embodiment, transistor $Q_5$ is disposed between the base of a respective one of transistor $Q_3$ and collector of differential pair transistor $Q_1$ to provide buffering with respect to the base current of transistor $Q_3$. Current source $I_5$ provides a bias current to buffer transistor $Q_5$.

The buffering provided by transistor $Q_5$ reduces the amount of base current that is tapped off the collector of transistor $Q_1$. Transistor $Q_5$ disposed in this configuration divides the amount of current that is tapped off of the collector of transistor $Q_1$ by the current gain of transistor $Q_5$. Accordingly, the linearity error term associated with the base current of the feedback transistors of transconductance amplifier 200 of FIG. 2 has been reduced by a factor equal to the current gain as compared to that of transconductance amplifier 100 of FIG. 1, and therefore results in improved linearity in the core transconductance amplifier.

It should be appreciated that buffer transistor $Q_5$ is coupled so as to substantially only drive a base current of feedback transistor $Q_3$. Accordingly, the load of $Q_5$ is relatively small and, therefore, this transistor may be appreciably smaller than transistor $Q_3$. Preferably transistor $Q_5$ is sized and biased for optimum speed of the device to minimize the delay with respect to the feedback loop. Specifically, the propagation delay associated with the feedback loop, in which transistor $Q_5$ is disposed, is preferably minimized in order to provide optimum operation with respect to transconductance amplifier 200. Accordingly, transistor $Q_5$ is preferably a small device with low capacitance and fast operating speed to minimize delay associated with the feedback loop.

As with transconductance amplifier 100 discussed above, a conversion of voltage to current is provided by transconductance amplifier 200 in that the collector current of differential pair transistors $Q_7$ and $Q_8$ is a function of the voltage provided to the base of a respective one of transistors $Q_1$ and $Q_2$. Transistors $Q_9$ and $Q_{10}$ are coupled to transistors $Q_7$ and $Q_8$ to provide current mirroring and, thereby, provide output current to drive desired circuitry. The gain of transconductance amplifier 200 is a function of the ratio of the sizing of transistors $Q_9$ and $Q_{10}$, and their respective emitter degeneration resistors $R_3$ and $R_4$, to the sizing of transistors $Q_7$ and $Q_8$, and their respective emitter degeneration resistors $R_1$ and $R_2$.

Preferred embodiments of the present invention provide a variable gain amplifier. Moreover, as mentioned above, amplifiers of the present invention preferably provide highly linear operation. Accordingly, variable gain circuitry may be provided in conjunction with the aforementioned highly linear transconductance amplifier according to the present invention. Preferably, variable gain circuitry of the present invention is adapted to provide highly linear operation throughout the dynamic range thereof, thereby providing a highly linear variable gain amplifier.

It should be appreciated that a technique of current steering has been used to provide variable gain with respect to an amplifier circuit. Specifically, an amplifier current may be steered in such a way that either all the current is provided to a desired output, or only a fraction of the current is provided to the desired output. However, such current steering techniques are typically only able to provide good linearity in a dynamic range of approximately 6–8 dB of attenuation. Accordingly, the use of known current steering techniques may not provide linearity with respect to a desired dynamic range, such as may be desired with respect to a cable head-end implementation.

Figure 3:
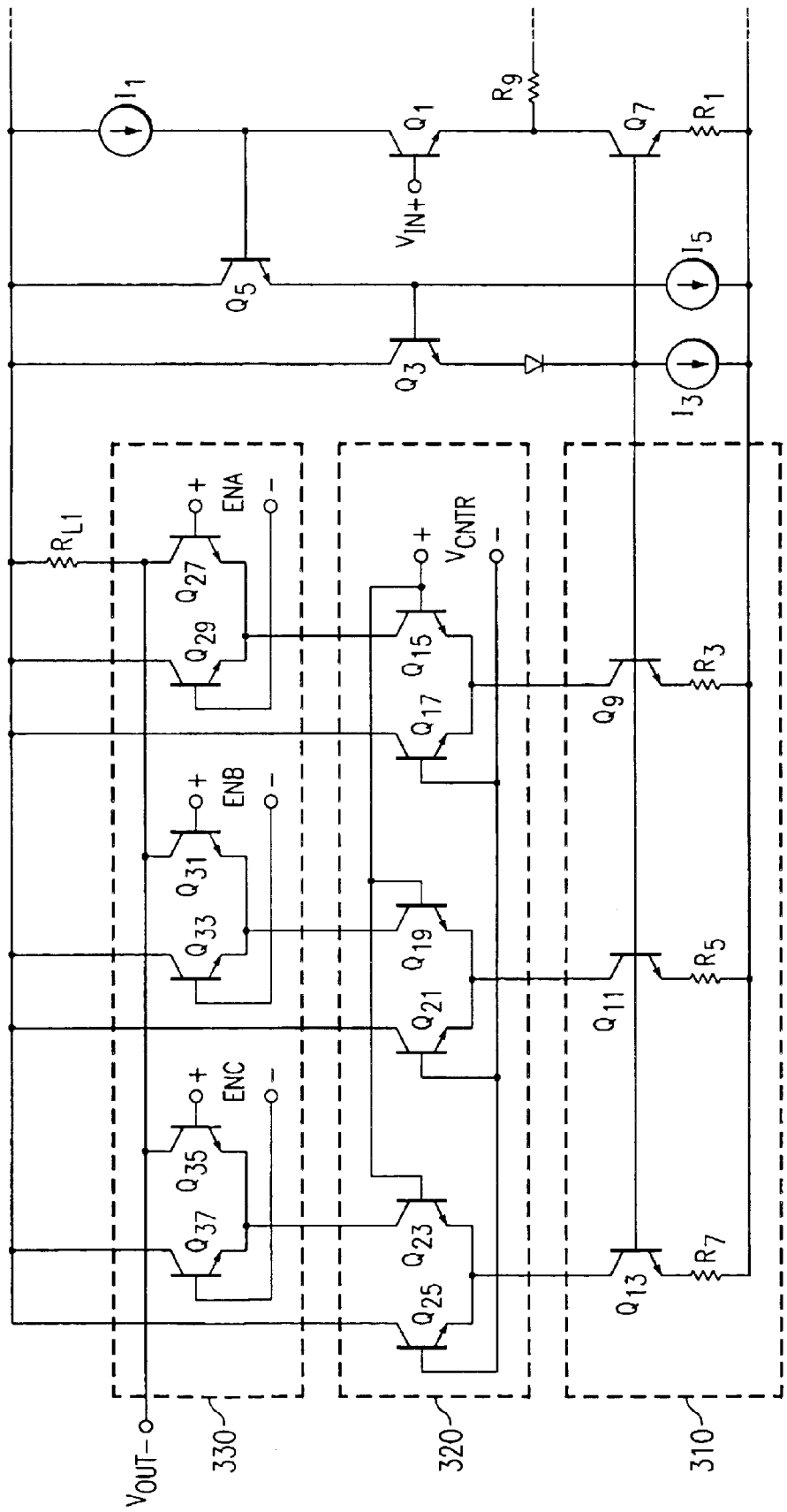
FIG. 3 shows variable gain circuitry according to an embodiment of the present invention.

Directing attention to FIG. 3, an embodiment of circuitry providing variable gain with respect to transconductance amplifier 200 is shown. It should be appreciated that, in order to simplify the illustration and description for an easier understanding by the reader, half of the variable gain circuit is shown in FIG. 3. Specifically, an embodiment of variable gain circuitry coupled to the left half of highly linear transconductance amplifier 200 is shown in FIG. 3. The half of the embodiment of variable gain circuitry coupled to the right half transconductance amplifier 200 is symmetrical with respect thereto and, therefore, is substantially a mirror image thereof. Of course, rather than $V_{OUT-}$ being provided by the right half of the variable gain circuitry, $V_{OUT+}$ is provided thereby.

The circuitry of FIG. 3 provides both coarse and fine gain selection. Specifically, coarse gain selection is provided by the coarse gain stages of coarse gain circuitry 310 and fine gain selection is provided by fine gain circuitry 320. Selection of a coarse gain stage or stages to provide output signals at any particular point in time is provided by utilizing switchable selection of selection circuitry 330.

As mentioned previously, the gain of the illustrated transconductance amplifier is a function of the ratio of the current mirrors utilized in providing output current mirroring the current of the differential pair transistors. Accordingly, coarse gain circuitry 310 of the illustrated embodiment provides three current mirror circuit portions for selection of an associated output current. Specifically, a first current mirror circuit portion is provided by transistor $Q_9$ and emitter degeneration resistor $R_3$ (it being appreciated that the half of the variable gain circuitry not illustrated preferably includes a corresponding current mirror circuit portion provided by transistor $Q_{10}$ and emitter degeneration resistor $R_4$). Similarly, a second current mirror circuit portion is provided by transistor $Q_{11}$ and emitter degeneration resistor $R_5$ (it being appreciated that the half of the variable gain circuitry not illustrated preferably includes a corresponding current mirror circuit portion provided by transistor $Q_{12}$ and emitter degeneration resistor $R_6$). Finally, a third current mirror circuit portion is provided by transistor $Q_{13}$ and emitter degeneration resistor $R_7$ (it being appreciated that the half of the variable gain circuitry not illustrated preferably includes a corresponding current mirror circuit portion provided by transistor $Q_{14}$ and emitter degeneration resistor $R_8$). Of course, although three coarse gain selection current mirrors are illustrated, embodiments of the present invention may include circuitry adapted to provide more or less increments of coarse gain selection.

The transconductance amplifier gain is a function of the sizing of transistors and their respective emitter degeneration resistors of an output current mirror, to the sizing of transistors $Q_7$ and $Q_8$, and their respective emitter degeneration resistors $R_1$ and $R_2$. Accordingly, by appropriately sizing the areas of the transistors and the corresponding emitter degeneration resistor, ratios may be selected to provide desired increments of gain selectivity. According to a preferred embodiment the ratios of each current mirror circuit portion is selected to provide binary coarse gain increments.

For example, a preferred embodiment provides a binary weighting with respect to 4 current mirrors of the coarse gain circuitry such that two of the stages have a weighting of ½, one of the stages has a weighting of 1, and one of the stages has a weighting of 2. This configuration provides a total weighting of 4 with the ability to select course steps of 6 dB by selecting the current mirrors alone or in combination. If the first weighted stage (a weighting of ½ relative to $Q_7$) is selected, a particular gain is achieved. If the second weighted stage (a weighting of ½ relative to $Q_7$) is also selected, a gain increase of 6 dB is achieved because the current has now been doubled. If the third weighted stage (a weighting of 1 relative to $Q_7$) is also selected, another gain increase of 6 dB is achieved because the current has again been doubled. Finally, if the fourth weighted stage (a weighting of 2 relative to $Q_7$) is also selected, another gain increase of 6 dB is achieved because the current has once again been doubled.

Of course, weighting selected for the various current mirror circuit portions may be different than that of the above described embodiment, if desired. For example, the weighting of one or more of the current mirror circuit portions may be selected for operation independent of other ones of the current mirror circuit portions.

Having provided coarse increments of gain adjustment using coarse gain circuitry 310, the illustrated embodiment further provides fine gain adjustment using fine gain circuitry 320. According to the illustrated embodiment, current steering circuitry is provided with respect to each of the aforementioned current mirror circuit portions. For example, differential pair transistors $Q_{15}$ and $Q_{17}$ are coupled to the collector of current mirror transistor $Q_9$ (it being appreciated that the half of the variable gain circuitry not illustrated preferably includes corresponding differential pair transistors $Q_{16}$ and $Q_{18}$ coupled to the collector of current mirror transistor $Q_{10}$), differential pair transistors $Q_{19}$ and $Q_{21}$ are coupled to the collector of current mirror transistor $Q_{11}$ (it being appreciated that the half of the variable gain circuitry not illustrated preferably includes corresponding differential pair transistors $Q_{20}$ and $Q_{22}$ coupled to the collector of current mirror transistor $Q_{12}$), and differential pair transistors $Q_{23}$ and $Q_{25}$ are coupled to the collector of current mirror transistor $Q_{13}$ (it being appreciated that the half of the variable gain circuitry not illustrated preferably includes corresponding differential pair transistors $Q_{24}$ and $Q_{26}$ coupled to the collector of current mirror transistor $Q_{14}$).

According to a preferred embodiment, the differential pair transistors of the current steers are sized to correspond to the sizing of the current mirror transistor coupled thereto. Although, a variety of configurations may be utilized with respect to the current steering transistors, embodiments of the present invention utilized the above mentioned transistor sizing to balance the capacitances and parasitics for each node and provide optimum performance.

The differential pair transistors of fine gain circuitry 320 provide controllable current steering with respect to a corresponding coarse gain stage coupled thereto. Accordingly, by controlling the voltage $V_{CNTR}$ as applied to the bases of the differential pair transistors, the amount of the collector current of the corresponding transistor of the current mirror transistors output by the variable gain circuitry may be selected. For example, current can be selectively steered to flow through load resistor $R_L$ to thereby provide a desired output voltage $V_{OUT-}$ ($V_{OUT+}$ in the half of the variable gain circuitry not illustrated).

Although a common control signal, $V_{CNTR}$, is shown with respect to the illustrated current steers, it should be appreciated that multiple such control signals may be utilized, if desired. For example, a separate control signal, e.g., $V_{CNTR1}$ $V_{CNTRL2}$, and $V_{CNTR3}$, may be utilized with respect to each current steer by decoupling the bases thereof.

It should be appreciated that the highly linear region of the above described differential pair current steer circuits is limited to approximately 6–8 dB of dynamic range. Accordingly, by combining the fine adjust capability of current steer with a course selection, such as described above, embodiments of the present invention maximize the overall linearity by taking advantage of the current steering pair in only its most linear state, and then digitally switching in and out some additional nodes to set course gain steps.

In order to provide selection of the coarse gain increments, the illustrated embodiment provides for switching currents on and off using selection circuitry 330. Specifically, the embodiment illustrated in FIG. 3 utilizes bipolar switches associated with the outputs of each of the aforementioned current mirror circuit portions. According to a preferred embodiment, the differential pair transistors of the bipolar switches are controlled to either direct all current to a desired output (switched "on") or to sink all current (switched "off").

According to a preferred embodiment, the differential pair transistors of the bipolar switches are sized to correspond to the sizing of the current mirror transistor coupled thereto. Although, a variety of configurations may be utilized with respect to the bipolar switch transistors, embodiments of the present invention utilized the above mentioned transistor sizing to balance the capacitances and parasitics for each node and provide optimum performance.

It should be appreciated that the bipolar switches of selection circuitry 330 may be disposed at various positions within the variable gain circuitry of the present invention. For example, rather than being disposed as illustrated, the bipolar switches may be disposed between the current mirror transistors of coarse gain circuitry 310 and the differential pair transistors of fine gain circuitry 320, if desired. However, simulation has suggested that the illustrated embodiment may provide superior performance. Specifically, providing the differential pairs of fine gain circuitry 320 as illustrated may be best for the fine steering of current as there is very little voltage variation on the collectors of transistors $Q_{15}$, $Q_{17}$, $Q_{19}$, $Q_{21}$, $Q_{23}$, and $Q_{25}$ resulting in very little modulation in the non-linear collector base capacitance. The current is then forced into a differential pair of the aforementioned bipolar switches, which is switched digitally, so it is either all the way off (where non-linearity of the voltage modulation of the bipolar differential pair does not effect the output) or all the way on (where the bipolar differential pair is operating with maximum linearity).

It should be appreciated that, in operation, the optimum linearity range of the current steer circuitry is approximately 6 dB. Using the coarse gain selection circuitry, embodiments of the present invention may operate within the linear dynamic range of a current steer and then switch out digitally and cover the next 6 dB of range with another fine current steer. Preferably, there is at least a small amount of overlap with respect to the linear regions of the fine current steer control to ensure there are no gaps in the aggregate dynamic range of the variable gain amplifier.

Figure 4:
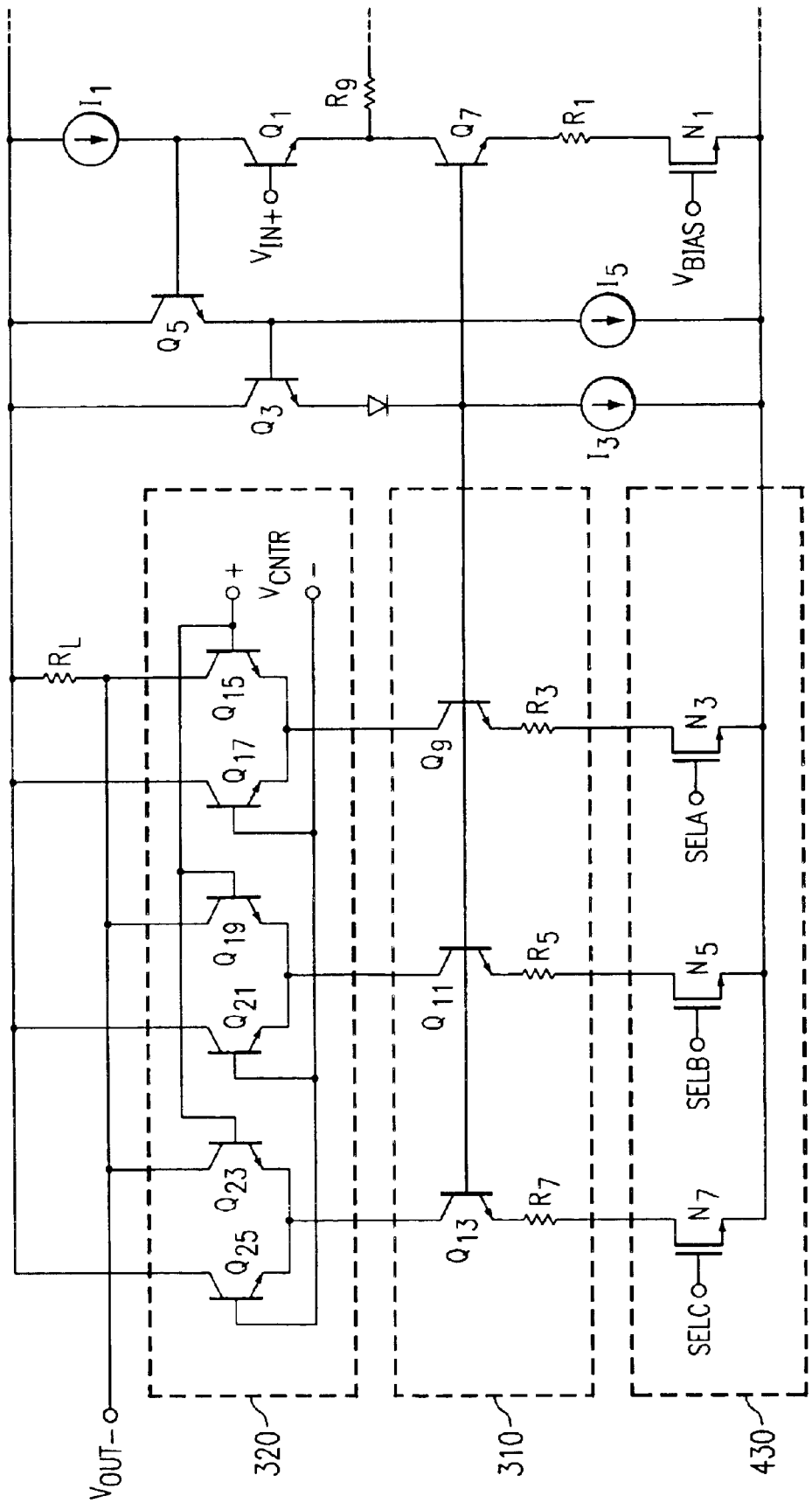
FIG. 4 shows variable gain circuitry according to an alternative embodiment of the present invention.

Directing attention to FIG. 4, an alternative embodiment for providing coarse gain selection is shown. Again, it should be appreciated that, in order to simplify the illustration and description for an easier understanding by the reader, half of the variable gain circuit is shown in FIG. 4. Specifically, an embodiment of variable gain circuitry coupled to the left half of highly linear transconductance amplifier 200 is shown in FIG. 4. The half of the embodiment of variable gain circuitry coupled to the right half transconductance amplifier 200 is symmetrical with respect thereto and, therefore, is substantially a mirror image thereof. Of course, rather than $V_{OUT-}$ being provided by the right half of the variable gain circuitry, $V_{OUT+}$ is provided thereby.

As with the variable gain circuitry of FIG. 3 discussed above, the variable gain circuitry of FIG. 4 includes coarse gain circuitry 310 and fine gain circuitry 320. Likewise, selection of a coarse gain stage or stages to provide output signals at any particular point in time is provided by utilizing switchable selection of selection circuitry 430. However, selection circuitry 430 incorporated a switch in series with the emitters of each current mirror transistor of the coarse gain circuitry.

Specifically, the switches of the illustrated embodiment are MOSFET transistors labeled as $N_3$, $N_5$, and $N_7$ (it being appreciated that the half of the variable gain circuitry not illustrated preferably includes corresponding MOSFET transistors $N_4$, $N_6$, and $N_8$). The illustrated embodiment provides switches $N_3$, $N_5$, and $N_7$ on the circuit ground side of the corresponding degeneration resistor. The switches of selection circuitry 430 are preferably controlled with a digital logic level input signal, shown as SELA, SELB, and SELC, respectively.

Although the switches may be disposed such that the degeneration resistors are on the circuit ground side thereof, the illustrated placement is preferred because any capacitance that appears on the drain shunts signal to ground and, ideally, the switch is taking the signal to ground anyway. Accordingly, the increased capacitance of a larger switching device would actually improve performance.

It should be appreciated that the embodiment of FIG. 4 includes a switch ($N_1$) disposed in the emitter path of transistor $Q_7$ (it being appreciated that the half of the variable gain circuitry not illustrated preferably includes corresponding switch ($N_2$) disposed in the emitter path of transistor $Q_8$) corresponding to the switches of selection circuitry 430. In typical operation, $N_1$ would not be switched on and off since it is disposed as a part of the core transconductance amplifier. However, preferred embodiments include this switch to provide matching with respect to the coarse gain stages. Preferably, switch $N_1$ would be biased, using input $V_{BIAS}$ to provide operation corresponding to that of selected ones of switches $N_3$, $N_5$, and/or $N_7$.

An advantage of the selection circuitry of FIG. 4 is that as stages of the coarse gain selection circuit are turned off, the current utilization of the variable gain amplifier is decreased. Accordingly, by selecting an appropriate gain stage, operation of the variable gain amplifier of FIG. 4 can result in a significant reduction in power consumption. However, it is more difficult to provide matching MOSFET transistors than the bipolar devices of the embodiment of FIG. 3.

An alternative embodiment of the variable gain circuitry of FIG. 4 may couple the collectors of one or more of current mirror transistors $Q_9$, $Q_{11}$, and $Q_{13}$ to a same current steer differential pair, thereby providing a shared current steer. Similarly, an alternative embodiment of the variable gain circuitry of FIG. 3 may dispose the bipolar switches of selection circuitry 330 between fine gain circuitry 320 and coarse gain circuitry 310 and, thereby, allow a current steer differential pair provide fine gain control with respect to a plurality of coarse gain circuit portions. Accordingly, a smaller footprint variable gain amplifier circuit may be provided. However, it may be preferable to provide a plurality of current steer circuit portions for fine gain selection, such as to provide a lower overall capacitance into which current is being driven.

It should be appreciated that the above described circuit configurations are well suited for implementation on a common substrate as an integrated circuit. Accordingly, preferred embodiment variable gain circuitry of the present invention may be disposed upon a common substrate to provide an integrated circuit. Similarly, variable gain amplifiers of the present invention may preferably be implemented as an integrated circuit.

It should be appreciated that, although described above with reference to the use of a core transconductance amplifier, the variable gain circuitry of the present invention may be utilized to provide variable gain with respect to a number of circuit configurations. Moreover, it should be appreciated that variable gain amplifiers of the present invention may be utilized to provide variable gain with respect to an input signal having a fixed level, e.g., to provide an output signal having a variable level, as well as to provide variable gain with respect to an input signal having a variable level, e.g., to provide an output signal having a fixed level.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the sane result as the corresponding embodiments described herein may be utilized according to the present invention. Accordingly, the appended claims are intended to include within their scope such processes, machines, manufacture, compositions of matter, means, methods, or steps.

What is claimed is:

1. A highly linear variable gain amplifier system comprising:
    a fine gain selection circuit, wherein said fine gain selection circuit provides highly linear operation throughout a predetermined dynamic range; and
    a coarse gain selection circuit, wherein said coarse gain selection circuit provides a coarse gain adjustment corresponding to said predetermined dynamic range, wherein said coarse gain selection circuit comprises a plurality of selectable gain stages, wherein each said gain stage of said plurality of selectable gain stages comprises a current mirror circuit.

2. The system of claim 1, wherein said fine gain selection circuit comprises a current steer circuit.

3. The system of claim 1, wherein said fine gain selection circuit comprises a plurality of current steer circuits, wherein each current steer circuit of said plurality of current steer circuits corresponds to a coarse gain stage of said coarse gain selection circuit.

4. The system of claim 1, further comprising:
    a transconductance amplifier, wherein an output of said transconductance amplifier is provided to said coarse gain selection circuit and said fine gain selection circuit to thereby provide a variable gain amplifier configuration.

5. A system for providing linear amplification of signals, said system comprising:
    a transconductance amplifier; and
    a variable gain circuit coupled to an output of said transconductance amplifier, wherein said variable gain circuit includes a fine gain control portion and a coarse gain control portion, wherein said coarse gain control portion of said variable gain circuit comprises a plurality of current mirrors coupled to said output of said transconductance amplifier, and wherein said fine gain control portion of said variable gain circuit comprises a plurality of current steer circuits.

6. A highly linear variable gain amplifier system comprising:
    a fine gain selection circuit, wherein said fine gain selection circuit provides highly linear operation throughout a predetermined dynamic range; and
    a coarse gain selection circuit, wherein said coarse gain selection circuit provides a coarse gain adjustment corresponding to said predetermined dynamic range, wherein said coarse gain selection circuit comprises a plurality of selectable gain stages, wherein said coarse gain selection circuit provides binary coarse gain increments.

7. The system of claim 6, wherein said predetermined dynamic range is from 0 dB to 6 dB.

8. The system of claim 6, wherein said predetermined dynamic range is from 0 dB to 8 dB.

9. A highly linear variable gain amplifier system comprising:
    a fine gain selection circuit, wherein said fine gain selection circuit provides highly linear operation throughout a predetermined dynamic range;
    a coarse gain selection circuit, wherein said coarse gain selection circuit provides a coarse gain adjustment corresponding to said predetermined dynamic range; and
    selection circuitry for selecting a desired level of gain provided by said coarse gain selection circuit.

10. The system of claim 9, wherein said selection circuitry comprises a current steer for selecting current of a gain stage of said coarse gain selection circuit for output.

11. The system of claim 10, wherein said fine gain selection circuit is disposed in said system between said selection circuit and said coarse gain selection circuit.

12. The system of claim 10, wherein said selection circuitry is disposed in said system between said fine gain selection circuit and said coarse gain selection circuit.

13. The system of claim 9, wherein said selection circuitry comprises a switch for disabling a gain stage of said coarse gain selection circuit.

14. A system for providing linear amplification of signals, said system comprising:
    a transconductance amplifier; and
    a variable gain circuit coupled to an output of said transconductance amplifier, wherein said variable gain circuit includes a fine gain control portion and a coarse gain control portion, wherein said variable gain circuit further includes a coarse gain selection portion, and wherein said coarse gain selection portion comprises a switch for enabling a gain stage of said coarse gain control portion.

15. A highly linear variable gain amplifier system comprising:
    a fine gain selection circuit, wherein said fine gain selection circuit provides highly linear operation throughout a predetermined dynamic range;

a coarse gain selection circuit, wherein said coarse gain selection circuit provides a coarse gain adjustment corresponding to said predetermined dynamic range; and a transconductance amplifier, wherein an output of said transconductance amplifier is provided to said coarse gain selection circuit and said fine gain selection circuit to thereby provide a variable gain amplifier configuration, wherein said transconductance amplifier comprises a feedback loop providing feedback of signals between two sets of differential pair transistors, wherein said feedback loop comprises a Darlington pair of transistors.

16. A system for providing linear amplification of signals, said system comprising:

a transconductance amplifier; and a variable gain circuit coupled to an output of said transconductance amplifier, wherein said variable gain circuit includes a fine gain control portion and a coarse gain control portion, wherein said coarse gain control portion of said variable gain circuit comprises a plurality of current mirrors coupled to said output of said transconductance amplifier, and wherein said plurality of current mirrors are adapted to provide gain in predetermined increments.

17. The system of claim 16, wherein said signals are cable television signals.

18. The system of claim 17, wherein said signals are provided said amplification by said system at a cable system head-end.

19. The system of claim 16, wherein said predetermined increments correspond to a dynamic range of said fine gain control portion of said variable gain circuit.

20. The system of claim 16, wherein said predetermined increments are less than 8 dB.

21. The system of claim 16, wherein said predetermined increments are 6 dB.

22. The system of claim 16, wherein said fine gain control portion of said variable gain circuit comprises:

at least one current steer circuit.

23. The system of claim 16, wherein said transconductance amplifier and said variable gain circuit are disposed upon a same substrate to thereby provide an integrated circuit.

24. The system of claim 16, wherein said transconductance amplifier includes a feedback circuit having a buffer transistor providing buffering of a base current of a feedback loop transistor.

25. The system of claim 16, wherein said variable gain circuit further includes a coarse gain selection portion.

26. A system for providing linear amplification of signals, said system comprising:

a transconductance amplifier; and a variable gain circuit coupled to an output of said transconductance amplifier, wherein said variable gain circuit includes a fine gain control portion and a coarse gain control portion, wherein said variable gain circuit further includes a coarse gain selection portion, and wherein said coarse gain selection portion comprises a current steer circuit for switchably selecting an output of a gain stage of said coarse gain control portion.

27. A system for providing linear amplification of signals, said system comprising:

a transconductance amplifier, wherein said transconductance amplifier includes a feedback circuit having a buffer transistor providing buffering with respect to a feedback loop transistor; and a variable gain circuit coupled to an output of said transconductance amplifier, wherein said variable gain circuit includes a fine gain control portion and a coarse gain control portion, wherein said coarse gain control portion of said variable gain circuit comprises a plurality of current mirrors coupled to said output of said transconductance amplifier, wherein said plurality of current mirrors are adapted to provide gain in predetermined increments.

28. The system of claim 27, wherein said predetermined increments correspond to a dynamic range of said fine gain control portion of said variable gain circuit.

29. The system of claim 27, wherein said fine gain control portion of said variable gain circuit comprises:

at least one current steer circuit.

30. The system of claim 29, wherein said fine gain control portion of said variable gain circuit comprises:

a plurality of current steer circuits, wherein a current steer circuit of said plurality of current steer circuits is coupled to each current mirror of said plurality of current mirrors.

31. A system for providing linear amplification of signals, said system comprising:

a transconductance amplifier, wherein said transconductance amplifier includes a feedback circuit having a buffer transistor providing buffering with respect to a feedback loop transistor; and a variable gain circuit coupled to an output of said transconductance amplifier, wherein said variable gain circuit includes a fine gain control portion and a coarse gain control portion, wherein said fine gain control portion provides continuous gain adjustment and said coarse gain control portion provides gain control in discrete steps.

32. The system of claim 31, wherein said buffer transistor provides buffering of a base current of said feedback loop transistor.

33. A method for providing highly linear variable gain amplification of a signal, said method comprising:

adapting a transconductance amplifier for linear operation;

providing coarse gain selection, wherein said coarse gain selection provides coarse gain adjustments corresponding to a predetermined increments; and providing fine gain adjustment, wherein said fine gain adjustment provides highly linear operation throughout a predetermined dynamic range, wherein said predetermined dynamic range corresponds to said predetermined increments.

34. The method of claim 33, wherein said adapting said transconductance amplifier for linear operation comprises:

buffering a feedback transistor of said transconductance amplifier.

35. The method of claim 33, wherein said providing coarse gain selection comprises:

providing a plurality of current mirror circuits, ones of which providing different weighting with respect to said transconductance amplifier.

36. The method of claim 35, wherein said providing coarse gain selection comprises:

selecting a current for output using a current steer switch circuit coupled to a current mirror circuit of said plurality of current mirror circuits.

37. The method of claim 35, wherein said providing coarse gain selection comprises:

enabling a current mirror circuit of said plurality of current mirror circuits.

* * * * *